United States Patent

[11] 3,575,643

[72] Inventors Michihisa Suga;
Kenji Sekido, Tokyo, Japan

[21] Appl. No. 806,198
[22] Filed Mar. 11, 1969
[45] Patented Apr. 20, 1971
[73] Assignee Nippon Electric Company, Limited
Tokyo, Japan
[32] Priority Mar. 12, 1968
[33] Japan
[31] 43/16304

[54] SEMICONDUCTOR HIGH FREQUENCY OSCILLATION DEVICE
5 Claims, 6 Drawing Figs.

[52] U.S. Cl. .......... 317/234, 331/107
[51] Int. Cl. .......... H01l 9/00
[50] Field of Search .......... 317/234.10; 331/107 (G)

[56] References Cited

OTHER REFERENCES

Solid State Electronics, " Synthesis of Complex Electronic Functions By Solid State Bulk Effects" by Sandbank, May, 1967 pages 369-379, 331/107G

*Primary Examiner*—Jerry D. Craig
*Attorney*—Hopgood & Calimafde

ABSTRACT: An improved efficiency semiconductor high frequency oscillator comprises semiconductor regions located between two ohmic electrodes. The impurity concentration is nonuniform throughout the regions, and as herein specifically, described, the impurity concentration may be greatest in an intermediate one of the regions.

*INVENTORS*
Michihisa Suga
Kenji Sekido by Sandoe, Hopgood & Calimafde
ATTORNEYS.

SEMICONDUCTOR HIGH FREQUENCY OSCILLATION DEVICE

This invention relates to a semiconductor high frequency oscillation device utilizing the periodic space-charge transit phenomenon based on the field controlled bulk negative resistance effect of a semiconductor and, more particularly, to a semiconductor high frequency oscillation device of the kind having improved oscillation efficiency.

When s semiconductor crystal exhibits a bulk negative resistance of electric field control type such that the drift velocity of the the carriers which dominates the electron conduction of the semiconductor crystal decreases with an increase in the limited range of the field intensity exceeding a certain threshold value, a high frequency oscillation device is obtained, as is well known, based on the transit time effect observed in the semiconductor crystal of the same conduction type. The widely known example of such a device is the Gunn effect oscillator using n-type gallium arsenide crystal.

The most basic and general Gunn effect oscillator comprises a pair of parallel and mutually facing ohmic electrodes formed on both major surfaces of a thin piece of n-type GaAs single crystal including nearly uniform effective donor concentration. In this structure, the effective donor concentration of the crystal and the distance between the two electrodes are so determined that the product of the donor concentration and the interelectrodes distance is not less than $10^{12}$ and $cm^{12}$.

Upon application of a DC voltage between the two electrodes of the Gunn effect oscillator, the conduction electrons show a negative differential mobility due to the electron transition effect when the mean field value of the crystal exceeds about 3 KV/cm. As a result, the formation and the periodic drift of the high field domain occurs and, accordingly, a current oscillation takes place. Specifically, when the high field domain begins to grow and to transit in the vicinity of the cathode, the applied voltage is almost totally absorbed by the high field domain. Consequently, the field intensity of the portion of the crystal other than the high field domain is lowered below the threshold field intensity, and the current flow in the element is accordingly reduced. When the high field domain reaches the anode and vanishes there, the current increases to the initial value. At this instant, however, another high field domain grows and the current decreases again. In this manner the Gunn effect current oscillation occurs.

Accordingly, in the device in which high frequency power is obtained by the above described current oscillation, the oscillation efficiency of the device, i.e. the ratio of high frequency output power to DC input power, depends on the relative amplitude (or modulation degree) of the current vibration in the crystal. It will be readily understood that the larger the content of fundamental wave component in the current oscillation waveform or, in other words, the smaller the content of the higher harmonic wave components, the greater will be the oscillation efficiency. Needless to say, the efficiency of an oscillator of this type is affected not only by the above-mentioned main causes but also by the coupling between of the element and the output circuit. Also, in the above-described oscillator, the semiconductor element is connected in most cases to a resonant circuit whose resonant frequency is nearly the same as the transit time oscillation frequency. In such a connection, the high frequency voltage is applied to the element by being superimposed on the DC voltage. Because of this superimposed high frequency voltage, the movement of the high field domain is somewhat different from the purely DC-bias state. Accordingly, the current waveform is somewhat different from the one in the case when the element is short-circuited in terms of high frequency voltage. The oscillation efficiency of the oscillation element disposed in the resonant circuit becomes higher in proportion to the relative amplitude of the current oscillation observed in the short-circuited state for the high frequency voltage and the content of the fundamental wave component. This fact has been recognized empirically and theoretically.

In the current oscillation phenomenon involving the high field domain transit due to the bulk negative resistance effect of field controlled type as in the Gunn effect oscillator, the current oscillation output waveform in a low load impedance state depends considerably on the concentration $N$ of impurities contributing to the generation of carriers in the crystal, and the distance $L$ between the electrodes. The time required for the growth of the domain is shorter than the transit time in those elements which have a larger value of the product of $N$ and $L$ In the letter elements, the resultant output waveform accordingly has a spike in the positive direction. In this case, therefore, the relative amplitude of the waveform is large but, at the same time, the content of high harmonic wave is also large. Whereas, in those elements have a small $N$–$L$ product value, the time required for the growth of the domain is nearly the same as the transit time. Accordingly, with those elements, the domain reaches the anode before it is sufficiently grown. Therefore, the relative amplitude of the current vibration is small but, instead, the waveform becomes similar to sine wave.

Experiments on the gallium arsenide Gunn effect oscillator show that the oscillation efficiency rarely exceeds 10 percent even in the case of pulse oscillation which is not influenced by a temperature rise in the element. To improve the efficiency of the Gunn effect oscillator, it has been proposed that a suitable external reactance circuit be connected to an element of a large $N$–$L$ product value to delay the phase of the high field domain formation aid, thereby to obtain an oscillation frequency as high as half of the transit time frequency. In this case, the amplitude of the current oscillation is nearly the same as that of the spike waveform, while the waveform becomes rich in the fundamental wave component, thereby to raise the oscillation efficiency. However, this advantage is attainable only in those relatively low frequency regions below 1 GHz. in which the distance $L$ can be made relatively large. Since there is an upper limit on the impurity concentration $N$ of the element because of the limitation on the power loss density, it is impossible to apply the above-mentioned proposal for improvement to the oscillators operative in the practically significant frequency region which ranges above several giga-hertz.

A principal object of this invention is to provide a semiconductor high frequency oscillation device operative with an improved oscillation efficiency. For this purpose, the present device resorts to the periodic transit of space-charge caused by the bulk negative resistance effect of the field controlled type. More specifically, this invention resides in that an appropriate nonuniformity is introduced into the impurity concentration distribution in the crystal of the semiconductor element constituting the high-frequency oscillation device, thereby allowing the current oscillation to be kept while at the same time achieving two significant advantages, to wit, a large amplitude obtainable in a semiconductor element of a large $N$–$L$ product value, and is a large content of the fundamental wave in the output of the element of a small $N$–$L$ product value.

According to this invention, a semiconductor device suitable for high frequency oscillation is provided in which the one-dimensional distribution of the impurity concentration in the crystalline active region contributing to the generation of the conduction carriers between its two ohmic electrodes is partially increased. More specifically, the impurity concentration is made greater in the limited region ranging in the middle portion between the two ohmic electrodes. Numerically, the impurity concentration in the high impurity concentration region is 1.5 to 10 times higher than the the normal regions between the electrodes separated by the high impurity concentration region. The effective value of the $N$–$L$ product in each of the high impurity concentration regions and the two separate regions of regular impurity distribution region is greater than the critical value (approximately $10^{12}$ $cm^{12}$ in the case of GaAs) necessary for the unstability factor in the Gunn effect oscillator, while the maximum to minimum ratio of the $N$–$L$ products in three regions is less than 5.

To examine the effect of the above-mentioned impurity concentration on the electrical characteristics of the semiconductor element, electronic computer simulation was employed. This simulation is done based on the equations expressing the motion of one-dimensional space-charge, as described in detail by Kroemer in IEEE Transactions on Electron Devices, vol. ED–13, No. 1, Jan. 1966, p.p. 27—60. Briefly, the expression is obtained as follows:

Poisson's equation:

$$\frac{\partial E}{\partial x}=\frac{q}{\epsilon}(n-n_0)$$

Continuity equation:

$$\frac{\partial n}{\partial t}=-\frac{1}{q}\cdot\frac{\partial j}{\partial x}$$

Current equation:

$$j-qn\bar{v}-q\frac{\partial(\theta\bar{\mu}n)}{\partial x}$$

Total current equation:

$$T=j+\epsilon\frac{\partial E}{\partial t}$$

where,

- E: field intensity (V/cm),
- $x$: distance from the cathode (cm),
- $q$: charge of electron ($\cong 1.9\times10^{119}$ coulomb),
- $\epsilon$: dielectricity of GaAs ($=12.5\times BQ8.85\times10^{114}$ farad/cm.)
- $n_0$: impurity concentration (/cm$^3$),
- $n$: electron density ( /cm$^3$),
- $t$: time (sec.),
- $j$: conduction current density (A/cm$^2$),
- $\bar{v}$: mean drift velocity of electron (cm./sec.),
- $\bar{\mu}$: mean mobility of electron (cm.$^2$/volt-sec.),
- $\theta$: electron temperature As a result of this electronic computer simulation it has been determined that the oscillation device of this invention is capable of increasing the relative amplitude while maintaining the content of the fundamental wave component in the current oscillation at a favorable level in the low load impedance operation. It has become apparent therefore that the semiconductor high frequency oscillation device made up of the crystal having the above-mentioned impurity distribution brings about a higher oscillation efficiency than the conventional device employing a crystal having uniform impurity concentration.

The foregoing and other objects, features, and advantages of the invention will be apparent from the following more particular description of a preferred embodiment of the invention taken in conjunction with the accompanying drawings, in which:

FIGS. 1*a* and *b* show a sectional view of a semiconductor oscillator according to a preferred embodiment of the invention, and the one-dimensional impurity concentration distribution in that oscillator respectively;

Figure 1A:
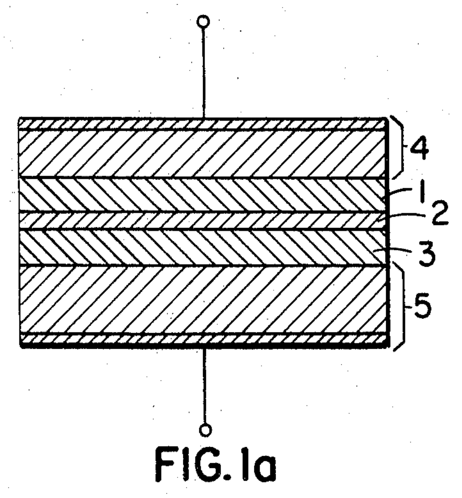
Figure 1B:
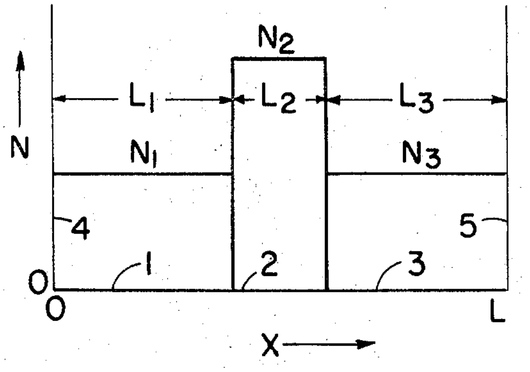

In FIG. 1*b*, in which reference numerals common to those used in FIG. 1*a* demote like portions of the oscillator shown in FIG. 1*a*, the effective donor concentration $N$ is shown as a function of the distance $x$ between cathode electrode 4 and anode electrode 5. As is shown, the donor impurity concentration $N_2$ of the region 2 occupying the middle portion of the cathode and anode electrodes 4 and 5 is approximately twice as large, for example, as the impurity concentrations $N_1$ and $N_3$ in the other regions 1 and 3. The $N$–$L$product, i.e. $N_1 L_1$, $N_2 L_2$ and $N_3 L_3$ in the active regions 1, 2, and 3, with $L_1$, $L_2$ and $L_3$ respectively representing the lengths of the regions 1, 2, and 3, must respectively be greater than $10^{12}$ cm$^{12}$, the minimum value of $N$–$L$ product for the Gunn effect oscillation. Moreover, it is preferable that, at least $N_1 L_1$ and $N_3 L_3$ be equal to or smaller than a value that is several times as great as the critical value of $NL$product.

To b, the understanding of the following description of the current oscillation waveform of the Gunn effect oscillation element having the impurity concentration distribution shown in FIG. 1*b*, the current waveform of the conventional Gunn effect oscillation element having a nearly uniform impurity distribution will be explained.

Figure 2:
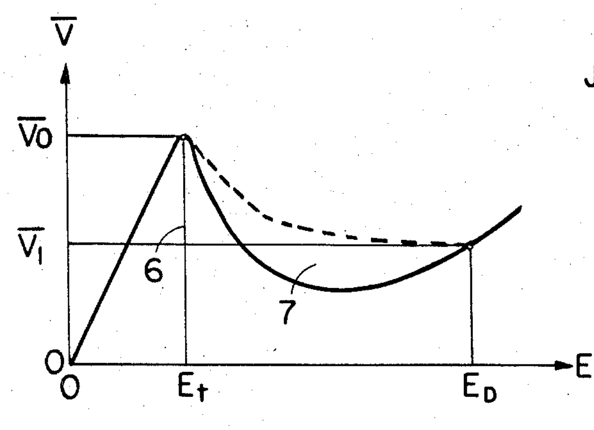
FIG. 2 shows a relationship between the field intensity in the semiconductor crystal and drift velocity of carriers or the high field domain in the oscillator of FIG. 1.

Application of an electric field greater than the Gunn effect threshold field intensity $F_t$ shown in FIG. 2 to the conventional Gunn oscillation element of nearly uniform impurity distribution causes a nucleus of high field domain to be formed in the vicinity of the cathode, and to be developed in its transit period. The field intensity within the high field domain is varied in the course of the transit growth process which take place along the dotted line of FIG. 2 in the $E_t$ to $E_D$ direction. The corresponding drift velocity $\bar{V}$ is reduced to $\bar{V}_1$ from $\bar{V}_0$. In FIG. 2, the areas 6 and 7 defined by the $\bar{V}$ vs. $E$ curve and the horizontal line crossing the ordinate at point $\bar{V}_1$ are nearly equal to each other. The growing velocity of the high-field domain is an inverse proportion to the negative relaxation time of the conduction system or to the impurity concentration $N$. The repetition rate of the high field domain formation is nearly inversely proportional to the distance $L$ between the cathode and anode electrodes 4 and 5.

Figure 3:
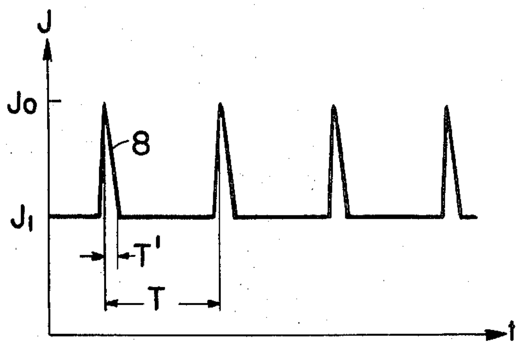
FIGS. 3 and 4 are waveforms of current oscillation output in the conventional Gunn effect device.

In the element having a large $N$–$L$product value, the growth of the high field domain is completed within a period of time $\tau'$ shorter than the transit time $\tau$, as is shown in FIG. 3. Also, the current $J$ is reduced from the current value $J_0$ corresponding to the drift velocity $\bar{V}_0$, to the current value $J_1$ corresponding to the drift velocity $\bar{V}_1$ shown in FIG. 2. The current waveform illustrated in FIG. 3 shows that the degree of slope of the current decreasing portion 8 depends directly on the impurity concentration $N$. In addition to the conduction current shown in FIG. 3, a certain amount of displacement current flows in the element. However, the effect of the latter is neglected in this specification for the sake of simplicity of explanation.

Figure 4:
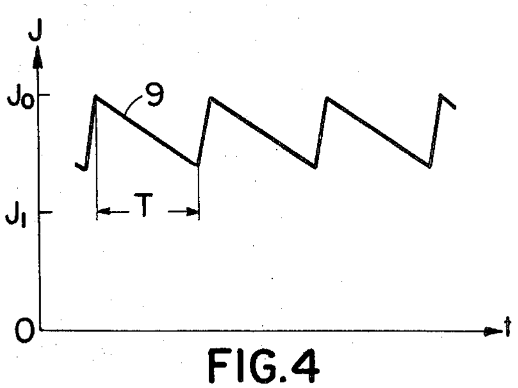

In the element having a low $N$–$L$product value in the order of the lower limit ($\cong$10$^{12}$ cm.$^{12}$), the growth of the high field domain is not completed within the transit time $\tau$. Therefore, as shown in FIG. 4, the conduction current $J$ decreases from the value $J_0$ corresponding to the drift velocity $\bar{V}_0$ of FIG. 2. However, before reaching the current value $J_1$ corresponding to the drift velocity $\bar{V}_1$, the succeeding high field domain is formed to increase the current toward the value $J_0$. Accordingly, the relative amplitude of oscillation becomes smaller than that shown in FIG. 3. It should be noted that the slope of the current decreasing portion 9 in the waveform of FIG. 4 is less than that of the portion 8 in FIG. 3.

Referring to the drawings, further explanation will be given as to the current oscillation waveform produced when a DC voltage is applied across electrodes 4 and 5 of the element of the nonlinear impurity concentration of FIG. 1, so that the field intensity at each of the three regions 1, 2 and 3 may exceed the threshold value $E_t$ for the negative resistance effect. In this case, the nucleus of the high field domain is formed near the cathode 4 of the region 1, to continue its growth, and makes a transit toward the median region 2. When the product of $N_1$ and $L_1$in the region 1 is of a relatively small value ($\cong$10$^{12}$ cm.$^{12}$), the waveform of the conduction current $J$ of the period $\tau_1$ is reduced from the peak current value $J_0$ to a current value slightly larger than the minimum current value $J_1$ shown in FIG. 5, along a relatively moderate slope 10 similar to the waveform portion 9 of FIG. 4. The voltage applied between the two electrodes 4 and 5 is determined so that the field intensity in the media median region 2 may be maintained at a sufficiently high level for the growth of the high field domain. Therefore, the domain moved into the region 2 continues further growth and makes a transit toward the region 3. Since the absolute value of the negative relaxation time in the region 2 is smaller than that in the region 1, the growing velocity of the high field domain during the period $\tau_2$ is larger than that during the period $\tau_1$.

Therefore, the current $J$ of the period $\tau_2$ decreases along a relatively steep slope 11 similar to the waveform portion 8 of FIG. 3, and reaches the minimum current value $J_1$. Most of the growing process of the high field domain is completed when it passes through the region 2. The growth is completed at the transit period $\tau_3$ in the region 3, and, the current $J$ reaches the minimum current value $J_1$ corresponding to the drift velocity $\overline{V}_1$ of FIG. 2 along a slope shown as waveform 12. When the high field domain reaches the anode electrode 5, the current $J$ is restored to the initial state in a relatively short period $\tau_4$ along a slope shown as waveform 15. In this manner one cycle of periodic oscillation takes place.

Figure 5:
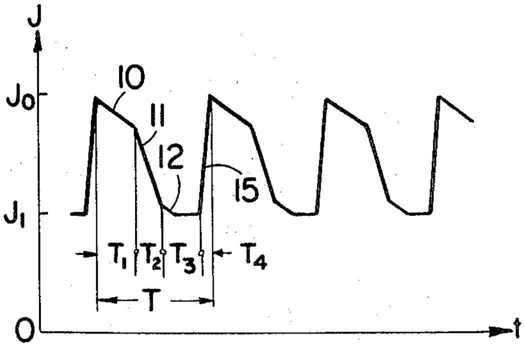
FIG. 5 is a waveform of current oscillation output obtained in the oscillator of FIG. 1.

Comparing the waveform of FIG. 5 with those of FIGS. 3 and 4, it is found that the relative amplitude of the oscillation in FIG. 5 is the same as that in an element of a large $N$–$L$ product shown in FIG. 3 and that the relative amplitude is larger than that of the element of a small $N$–$L$ product value as shown in FIG. 4. It is obvious that the content of the fundamental wave component of the waveform of FIG. 5 is greater than that of the waveform of FIG. 3. Also, it is evident that when the impurity distribution as shown in FIG. 1 is suitably selected, the content of the fundamental wave component of FIG. 5 can be made larger than that of the waveform of FIG. 4.

An example of the impurity distribution and geometry of the GaAs element suited for attaining the features of this invention is as follows (See FIG. 1*a*:

$N_1=_3=4\times10^{15}$ cm.[13], $N_2=8\times10^{15}$ cm.[13], $L_1=_3=4$ $\mu$, and $L_2=\mu$. With this sample, the maximum to minimum ratio of the actual current oscillation output (fundamental frequency: 9 GHz) obtained by the application of DC power at 12 $V$ to the element in the state where the load is shorted with respect to high frequency is 1.83. This value is 7.5 percent larger than the value 1.70 obtainable with the element having a nearly uniform impurity distribution. Also, the current oscillation output waveform has greater similarity to a sine wave than that having element of the nearly uniform impurity distribution. Since the oscillation efficiency of an oscillation device is nearly proportional to the square of the current oscillation amplitude, it is believed that the oscillation efficiency of the present Gunn effect oscillation device is increased by about 15 percent as compared with that of similar conventional Gunn effect device.

It becomes clear from the foregoing that the oscillation efficiency of the present semiconductor high frequency oscillation device is higher than that of the similar conventional device.

The impurity distribution as shown in FIG. 1*b* is not always necessary to attain desirable features of the invention. The curve of FIG. 1*b* shows the case where the impurity concentration is discontinuously changed in the boundary regions between region 2 and each of regions 1 and 3. However, this discontinuity or the abrupt change of the impurity concentration is not essential to this invention. The technical advantage of the present invention can be attained even if the change in the impurity concentration in the boundary is moderate and continuous. Also, the impurity concentration need not always be uniform over each region. Even if there is a certain spatial variation in the impurity concentration in one or more of the regions, the objectives of the invention are still attained. In this case, the effective $N$–$L$ produce value of each region is expressed by a spatial integration of the impurity concentration in the corresponding region.

The semiconductor crystal having the impurity distribution shown in FIG. 1 can be readily fabricated resorting to conventional semiconductor manufacturing methods. To increase the impurity concentration in the medial region 2 of the crystal piece, for example, an excessive amount of $H_2S$ gas containing the donor impurity is introduced into the carrier gas in the process of vapor phase epitaxial growth in the GaAs crystal.

While the invention has been explained only in relation to a Gunn effect oscillation device, it is to be understood that the invention is effectively applicable to all semiconductor high frequency oscillation devices of the transit time type based on the field controlled bulk negative resistance effect.

We claim:

1. A semiconductor high frequency oscillation device utilizing the periodic space-charge transit phenomenon comprising first, second and third semiconductor regions exhibiting the bulk negative resistance of the field controlled type, said second region being interposed between said first and said third region, and first and second ohmic electrodes respectively attached to the surface of each said first and said third regions opposite to said second region, the mean impurity concentration of said second region being in the range of 1.5 to 10 times as great as that of said first and third regions, the effective values of the product of impurity concentration and length of said first, second and third regions being greater than the critical value necessary for causing said space-charge transit phenomenon, and the maximum to minimum ratio of the value of said products being equal to or less than 5.

2. The device of claim 1, in which the mean impurity concentrations of said first and third regions are substantially equal, the mean impurity concentration of said second region being approximately twice that of said first and third regions.

3. The oscillation device of claim 2, in which the lengths of said first and third regions are substantially equal and are approximately twice the length of said second.

4. The oscillation device of claim 1, in which the mean impurity concentration in each of said regions is substantially uniform, and in which there is a discontinuity in the impurity concentration between said second region and each of said first and third regions.

5. The oscillation device of claim 2, in which the mean impurity concentration in each of said regions is substantially uniform, and in which there is a discontinuity in the impurity concentration between said second region and each of said first and third regions.

UNITED STATES PATENT OFFICE
CERTIFICATE OF CORRECTION

Patent No. 3,575,643 Dated April 20, 1971

Inventor(s) Michihisa Suga et al.

It is certified that error appears in the above-identified patent and that said Letters Patent are hereby corrected as shown below:

Column 6, line 48, after "second" insert -- region --.

Signed and sealed this 17th day of August 1971.

(SEAL)
Attest:

EDWARD M.FLETCHER,JR.
Attesting Officer

WILLIAM E. SCHUYLER, JR.
Commissioner of Patents